US010941342B2

(12) United States Patent
Kim et al.

(10) Patent No.: US 10,941,342 B2
(45) Date of Patent: Mar. 9, 2021

(54) ETCHANT COMPOSITION AND METHOD OF MANUFACTURING WIRING SUBSTRATE USING THE SAME

(71) Applicants: Samsung Display Co., Ltd., Yongin-si (KR); DONGWOO FINE-CHEM CO., LTD., Iksan-si (KR)

(72) Inventors: Bong Kyun Kim, Hwaseong-si (KR); Jin Suek Kim, Daejeon (KR); Seung Bo Shim, Asan-si (KR); Shin Hyuk Choi, Suwon-si (KR); Seung Hee Kim, Asan-si (KR); Dong Hee Lee, Hwaseong-si (KR); In Seol Kuk, Jeonju-si (KR); Beom Soo Kim, Seoul (KR); Sang Tae Kim, Iksan-si (KR); Young Chul Park, Cheonan-si (KR); Young Jin Yoon, Jeonju-si (KR); Dae Sung Lim, Jeonju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/505,712

(22) Filed: Jul. 9, 2019

(65) Prior Publication Data

US 2020/0024516 A1 Jan. 23, 2020

(30) Foreign Application Priority Data

Jul. 23, 2018 (KR) .................... 10-2018-0085320

(51) Int. Cl.
*C09K 13/06* (2006.01)
*C09K 13/12* (2006.01)

(52) U.S. Cl.
CPC .............. *C09K 13/06* (2013.01); *C09K 13/12* (2013.01)

(58) Field of Classification Search
CPC ... C09K 13/06; C09K 13/12; H01L 21/32134; C23F 1/16; C23F 1/18; C23F 1/26; H05K 3/067
See application file for complete search history.

(56) References Cited

U.S. PATENT DOCUMENTS

| 7,081,237 | B2 | 7/2006 | Mueller et al. |
| 7,915,696 | B2 | 3/2011 | Hays et al. |
| 2017/0029958 | A1* | 2/2017 | An ........................... C23F 1/18 |
| 2017/0233804 | A1 | 8/2017 | Reid et al. |

FOREIGN PATENT DOCUMENTS

| KR | 10-2009-0042173 | 4/2009 |
| KR | 10-2009-0074828 | 7/2009 |
| KR | 10-2009-0085436 | 8/2009 |
| KR | 10-2015-0034001 | 4/2015 |
| KR | 10-2016-0112471 | 9/2016 |
| KR | 10-2017-0069273 | 6/2017 |
| KR | 10-2017-0096367 | 8/2017 |
| KR | 10-2018-0066764 | 6/2018 |

\* cited by examiner

*Primary Examiner* — Nadine G Norton
*Assistant Examiner* — Mahmoud Dahimene
(74) *Attorney, Agent, or Firm* — H.C. Park & Associates, PLC

(57) ABSTRACT

An etchant composition may include: a peroxosulfate; a cyclic amine compound; a first amphoteric compound including a carboxyl group; and a second amphoteric compound including a sulfone group, wherein the second amphoteric compound may be different from the first amphoteric compound.

19 Claims, 7 Drawing Sheets

ETCHANT COMPOSITION AND METHOD OF MANUFACTURING WIRING SUBSTRATE USING THE SAME

CROSS REFERENCE TO RELATED APPLICATION

This application claims priority from and the benefit of Korean Patent Application No. 10-2018-0085320, filed on Jul. 23, 2018, which is hereby incorporated by reference for all purposes as if fully wet forth herein.

BACKGROUND

Field

Exemplary embodiments of the invention relate generally to an etchant composition and, more specifically, to a method of manufacturing a wiring substrate.

Discussion of the Background

The importance of a display device has increased with the development of multimedia. Accordingly, various types of display devices such as a liquid crystal display (LCD) and an organic light emitting display (OLED) have been used.

A display device may include a plurality of pixels that represent different colors to implement image display and color display. In order for the respective pixels of the display device to operate independently of each other, the display device may include a wiring substrate including a driving signal wiring for transmitting a driving signal, a thin film transistor, and the like.

The driving signal wiring of the wiring substrate requires low electrical resistance, high thermal stability, easy processability, and excellent adhesiveness. In order to satisfy such characteristics, the driving signal wiring may be formed to have a laminate structure of a plurality of layers of different materials.

The driving signal wiring of the wiring substrate is required to have an appropriate shape or profile as well as physical properties of a material itself such as electrical resistance, thermal stability, processability, and adhesiveness. For example, when the side inclination angle of the drive signal wiring is too large, due to the abrupt step formed by the wiring, a poor coverage may occur in the components stacked thereon.

Meanwhile, when the driving signal wiring may be formed to have a laminate structure of a plurality of layers, the etching properties of the respective layers may be different, and the degree of etching may be different, and it is more difficult to control the profile of the driving signal wiring.

The above information disclosed in this Background section is only for understanding of the background of the inventive concepts, and, therefore, it may contain information that does not constitute prior art.

SUMMARY

A composition and methods according to exemplary implementations of the invention are capable of providing an etchant composition capable of easily controlling the profile of a driving signal wiring.

Also, methods according to exemplary implementations of the invention are capable of providing a method of manufacturing a wiring substrate having improved processability and having characteristics such as low electrical resistance and high thermal stability.

Additional features of the inventive concepts will be set forth in the description which follows, and in part will be apparent from the description, or may be learned by practice of the inventive concepts.

According to one or more exemplary embodiments, an etchant composition, includes: a peroxosulfate; a cyclic amine compound; a first amphoteric compound including a carboxyl group; and a second amphoteric compound including a sulfone group, wherein the second amphoteric compound may be different from the first amphoteric compound.

A weight ratio of the first amphoteric compound to the second amphoteric compound may be equal to or between 2:1 and 1:5.

A weight percentage of the peroxosulfate may be greater than a weight percentage of the first amphoteric compound.

The first amphoteric compound may include at least one of compounds represented by Formulae Ia, Ib, Ic, Id, and Ie below:

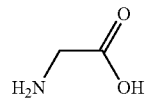

Formula Ia

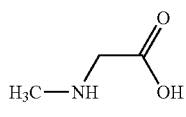

Formula Ib

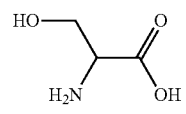

Formula Ic

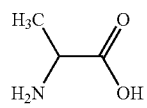

Formula Id

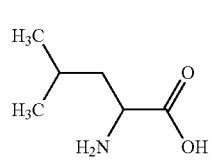

Formula Ie

The second amphoteric compound may include at least one of compounds represented by Formulae IIa, IIb, and IIc below:

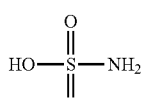

Formula IIa

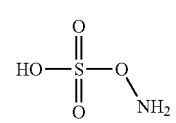

Formula IIb

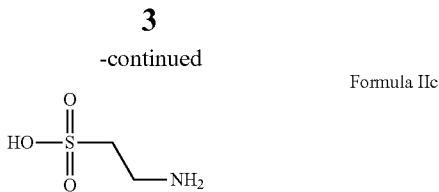

Formula IIc

The weight percentage of the peroxosulfate is equal to or between 1.0 wt % and 20.0 wt %, the weight percentage of the cyclic amine compound is equal to or between of 0.1 wt % and 5.0 wt %, the weight percentage of the first amphoteric compound is equal to or between of 0.01 wt % and 10.0 wt %, and the weight percentage of the second amphoteric compound is equal to or between 0.1 wt % and 7.0 wt %.

The peroxosulfate may include potassium peroxodisulfate ($K_2S_2O_8$), sodium peroxodisulfate ($Na_2S_2O_8$), and ammonium peroxodisulfate (($NH_4)_2S_2O_8$).

The cyclic amine compound may include at least one of 5-aminotetrazole, 1-methyl-5-aminotetrazole, 5-methyltetrazole, 1-ethyl-5-aminotetrazole, imidazole, indole, purine, pyrazole, pyridine, pyrimidine, pyrrole, pyrrolidine, and pyrroline.

The etchant composition may further include: equal to or between 0.01 wt % and 2.0 wt % of a fluorine-containing compound; equal to or between 0.01 wt % and 5.0 wt % of a chlorine-containing compound; equal to or between 0.5 wt % and 10.0 wt % of an inorganic acid; and equal to or between 1.0 wt % and 20.0 wt % of an organic acid or an organic acid salt.

A weight ratio of the organic acid or the organic acid salt to the first amphoteric compound may be equal to or between 15:1 to 1:2.

The fluorine-containing compound may include at least one of ammonium fluoride, sodium fluoride, potassium fluoride, ammonium bisulfite, sodium bisulfite, and potassium bisulfite.

The chlorine-containing compound may include at least one of hydrochloric acid, sodium chloride, potassium chloride, ammonium chloride, iron chloride (III), sodium perchlorate, potassium perchlorate, ethanesulfonyl chloride, and methanesulfonyl chloride.

The inorganic acid may include nitric acid ($HNO_3$), sulfuric acid ($H_2SO_4$), phosphoric acid ($H_3PO_3$), and phosphorous acid ($H_2PO_3$).

The organic acid may include at least one of acetic acid, formic acid, propenoic acid, butanoic acid, pentanoic acid, gluconic acid, glycolic acid, malonic acid, oxalic acid, benzoic acid, succinic acid, phthalic acid, salicylic acid, lactic acid, glyceric acid, malic acid, tartaric acid, citric acid, and isocitric acid, and wherein the organic acid salt may include a sodium salt, potassium salt or ammonium salt of the organic acid.

The etchant composition may further include: equal to or between 0.01 wt % and 5.0 wt % of a copper salt, wherein the copper salt may include copper sulfate, copper chloride, and copper nitrate.

According to one or more exemplary embodiments, a method of manufacturing a wiring substrate includes: forming a first wiring layer on a substrate, including: forming a first metal layer on the substrate; forming a second metal layer on the first metal layer, the second metal layer being different from the first metal layer; and patterning the first metal layer and the second metal layer using an etchant composition, wherein the etchant composition may include a peroxosulfate; a cyclic amine compound; a first amphoteric compound including a carboxyl group; and a second amphoteric compound including a sulfone group, and wherein the second amphoteric compound may be different from the first amphoteric compound.

The first metal layer may include at least one of a titanium layer and a titanium alloy layer, and wherein the second metal layer may include at least one of a copper layer and a copper alloy layer.

The method of manufacturing the wiring substrate may further include: forming a second wiring layer on the substrate before the forming of the first wiring layer, wherein, in the forming of the first wiring layer, the first wiring layer is formed on the second wiring layer to be insulated from the second wiring layer, and wherein the second wiring layer may include at least one of a titanium layer, a titanium alloy layer, a copper layer, and a copper alloy layer, which are mutually laminated.

A side inclination angle of the second wiring layer may be smaller than a side inclination angle of the first wiring layer, and wherein the side inclination angle of the first wiring layer is equal to or between 55° and 80°.

The first wiring layer may include a first region, a second region, and a third region, and wherein the patterning of the first metal layer and the second metal layer using the etchant composition may include: forming a mask pattern on the first region and the second region of the first metal layer and the second metal layer; primarily etching the third region of the first metal layer and the second metal layer not overlapping the mask pattern, using the etchant composition; removing the mask pattern on the second region of the first metal layer and the second metal layer; and secondarily etching the second region of the first metal layer and the second metal layer using the etchant composition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION THE EXEMPLARY EMBODIMENT

Figure 1:
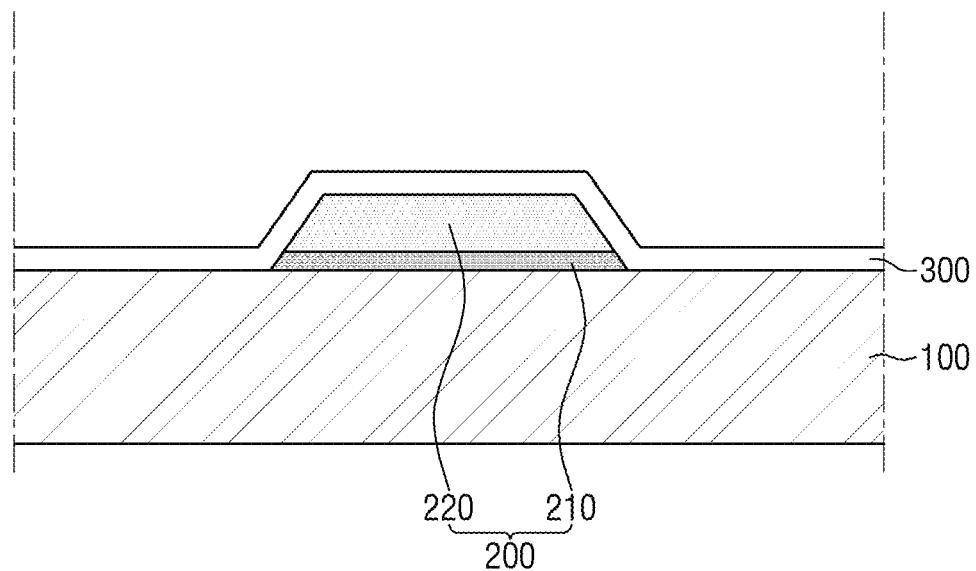
FIGS. 1, 2, 3, 4, 5, 6, 7, 8, and 9 are cross-sectional views sequentially illustrating a method of manufacturing a wiring substrate according to an exemplary embodiment of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

An etchant composition according to an exemplary embodiment may include peroxosulfate, a cyclic amine compound, a first amphoteric compound having a carboxyl group, and a second amphoteric compound having a sulfone group. As used herein, the "amphoteric compound" refers to a compound that forms an amphoteric ion in an aqueous solution state and is substantially neutral with electropositivity and electronegativity. The etchant composition according to the present exemplary embodiment may have excellent batch etching properties for copper (Cu) and titanium (Ti), but the exemplary embodiments are not limited thereto.

The peroxosulfate may be a main etching component for a copper layer including copper or a copper alloy including a copper component. Examples of the peroxosulfate may include, but are not limited to, potassium peroxodisulfate ($K_2S_2O_8$), sodium peroxodisulfate ($Na_2S_2O_8$), or ammonium peroxodisulfate (($NH_4)_2S_2O_8$).

The content of the peroxosulfate in weight percent may be about 1.0 wt % to about 20.0 wt % based on the total weight of the etchant composition. When the content of the peroxosulfate is less than 1.0 wt %, the etchant composition may not have sufficient etching characteristics for a copper component. For example, when the wiring includes a copper layer and a titanium layer, the titanium layer may be excessively etched as compared with the copper layer, resulting in a poor wiring profile. Further, when the content of the peroxosulfate is more than 20.0 wt %, an etching rate may excessively increase, and thus it may be difficult to control the etching process. For example, when the wiring includes a copper layer and a titanium layer, the copper layer may be excessively etched as compared with the titanium layer or it is not possible to secure a sufficient time for etching the titanium layer.

The cyclic amine compound may be an auxiliary etching component that controls the etching rate for a copper layer including copper or a copper alloy including a copper component and induces uniform etching of the copper layer to form a good profile. As used herein, the "cyclic amine compound" refers to a cyclic compound having an amine group. For example, the cyclic amine compound may be an alicyclic heterocyclic compound having an amine group in a ring structure, or an aromatic heterocyclic compound. The ring structure may be a 4-membered hetero ring, a 5-membered hetero ring, or a 6-membered hetero ring. The ring structure having an amine group may form a fused ring with another ring structure. The amine group may be a secondary amine (—NH—) or a tertiary amine (=N—), but the exemplary embodiments are not limited thereto.

The cyclic amine compound may include at least one of a tetrazole compound such as 5-aminotetrazole, 1-methyl-5-aminotetrazole, 5-methyltetrazole, or 1-ethyl-5-aminotetrazole, imidazole, indole, purine, pyrazole, pyridine, pyrimidine, pyrrole, pyrrolidine, and pyrroline, but the exemplary embodiments are not limited thereto.

The content of the cyclic amine compound in weight percent may be about 0.1 wt % to about 5.0 wt %, and more particularly, about 0.1 wt % to about 2.0 wt % based on the total weight of the etchant composition. When the content of the cyclic amine compound is less than 0.1 wt %, the copper layer may be etched non-uniformly without having the characteristics of controlling the etching rate of a copper component. For example, when the wiring includes a copper layer and a titanium layer, the copper layer may be excessively etched as compared with the titanium layer, so as not to form a uniform side profile. Further, when the content of the cyclic amine compound is more than 5.0 wt %, the etching characteristics for the copper layer may be deteriorated. Further, the solubility of the cyclic amine compound in the etchant composition may decrease to deteriorate processability.

The first amphoteric compound has a carboxyl group (—COOH), and may be substantially electrically neutral in an aqueous solution state. For example, the first amphoteric compound may be a compound having both a carboxyl group and an amine group and being neutral in an aqueous solution state. For example, the first amphoteric compound may be any one of compounds represented by Formulae Ia, Ib, Ic, Id, and Ie illustrated below, but the exemplary embodiments are not limited thereto.

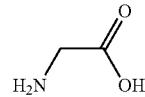

Formula Ia

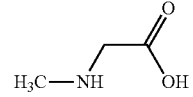

Formula Ib

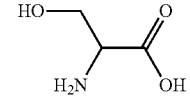

Formula Ic

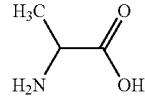

Formula Id

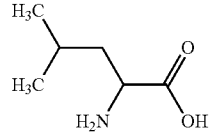

Formula Ie

The first amphoteric compound may prevent or reduce the reduction of a side inclination angle of a copper layer including a copper component even when the number of wirings to be etched using the etchant composition, that is, the number of wiring substrates to be processed is accumulated. Further, the first amphoteric compound may contribute to the improvement of a profile of a titanium layer including a titanium component.

The content of the first amphoteric compound in weight percentage may be about 0.01 wt % to about 10.0 wt %, and more particularly, about 0.1 wt % to about 5.0 wt % based on the total weight of the etchant composition. When the content of the first amphoteric compound is 0.01 wt % or more, an effect of preventing or reducing the reduction of the side inclination angle of a copper layer and/or an effect of improving the profile of a titanium layer may be exhibited. Further, when the content of the first amphoteric compound is 5.0 wt % or less, a wiring having an improved profile without decreasing the etching rate for the copper layer and the titanium layer.

The second amphoteric compound has a sulfone group (—$SO_3H$), and may be substantially electrically neutral in an aqueous solution state. The second amphoteric compound is a different compound from the first amphoteric compound, and may have a different function from the first amphoteric compound. For example, the second amphoteric compound may be a compound having both a sulfone group and an amine group and being neutral in an aqueous solution state. For example, the second amphoteric compound may be any one of compounds represented by Formulae IIa, IIb, and IIc below, but the exemplary embodiments are not limited thereto.

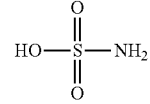

Formula IIa

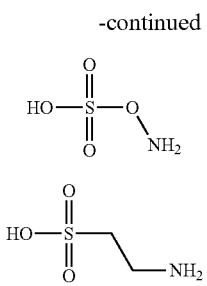

Formula IIb

Formula IIc

The second amphoteric compound has a chelating effect with metal ions such as copper ions or titanium ions, and may inhibit the metal ions from acting as impurities in the etchant composition. Simultaneously, the second amphoteric compound may be an auxiliary etching component for a copper layer including a copper alloy including copper or a copper component. This makes it possible to increase the number of wiring substrates to be processed in the etchant composition according to the present exemplary embodiment and improve processability.

The content of the second amphoteric compound in weight percent may be about 0.1 wt % to about 7.0 wt %, and more particularly, about 0.2 wt % to about 5.0 wt % based on the total weight of the etchant composition. When the content of the second amphoteric compound is 0.1 wt % or more, the second amphoteric compound exhibits a sufficient chelating effect, and may improve the etching rate for the copper layer. Further, an effect of increasing the number of wiring substrates to be processed in the etchant composition according to the present exemplary embodiment may be exhibited. When the content of the second amphoteric compound is 7.0 wt % or less, it is possible to form a wiring preventing or reducing the over-etching for the copper layer and including a copper layer having an improved profile.

In some exemplary embodiments, the content of the first amphoteric compound and the content of the second amphoteric compound, described above, may be in a specific relationship. For example, the weight ratio of the first amphoteric compound to the second amphoteric compound may be in a range of about 2:1 to about 1:5. When the weight ratio of the first amphoteric compound and the second amphoteric compound satisfies the above range, the etching rate of the etchant composition may be further improved, and furthermore, better characteristics may be exhibited for precipitation of a copper component and the precipitation of a silicon component. This will be described later in detail with experimental examples.

Further, the content of the peroxosulfate and the content of the first amphoteric compound may be in a specific relationship. In an exemplary embodiment, the content (e.g., weight) of the peroxosulfate may be greater than or equal to the content (e.g., weight) of the first amphoteric compound. When the content of the first amphoteric compound may be greater than the content of the peroxosulfate, Copper etching characteristics may be deteriorated by the first amphoteric compound, and for example, a poor etching of a copper component not being etched may occur. This will be described later in detail with experimental examples.

In some exemplary embodiments, the etchant composition may further include a fluorine-containing compound, a chlorine-containing compound, an inorganic acid, an organic acid or an organic acid salt, and a balance of a solvent.

The fluorine-containing compound may be a main etching component for a titanium layer including a titanium alloy including titanium or a titanium component. The fluorine-containing compound may improve etching characteristics by removing residues that may occur in the etching process using the etching composition. The fluorine-containing compound is not particularly limited as long as it can form fluorine ions or polyatomic fluorine ions in an aqueous solution. For example, the fluorine-containing compound may include at least one of ammonium fluoride, sodium fluoride, potassium fluoride, ammonium bisulfite, sodium bisulfite, and potassium bisulfite.

The content of the fluorine-containing compound in weight percent may be about 0.01 wt % to about 2.0 wt %, and more particularly, about 0.05 wt % to about 1.0 wt %, based on the total weight of the etchant composition. When the content of the fluorine-containing compound is less than 0.01 wt %, etching characteristics for a titanium layer is are not sufficient, and the etching rate of the titanium layer is lowered, and thus residues may be generated. When the content of the fluorine-containing compound is more than 2.0 wt %, a base substrate constituting a wiring substrate including a wiring, and/or a silicon insulating layer may be damaged.

The chlorine-containing compound may improve a process margin by improving the etching rate of a copper layer to improve the critical dimension (CD) loss of the patterned wiring. Further, the chlorine-containing compound may exhibit an effect of improving processability by suppressing the partial over-etching of a wiring. The chlorine-containing compound is not particularly limited as long as it can form chlorine ions in an aqueous solution. For example, the chlorine-containing compound may include at least one of hydrochloric acid, sodium chloride, potassium chloride, ammonium chloride, iron chloride (III), sodium perchlorate, potassium perchlorate, ethanesulfonyl chloride, and methanesulfonyl chloride. The critical dimension (CD) loss, which is one of defective pattern profiles occurring when a difference between a vertical etching rate and a horizontal etching rate is not large, refers to a defect that a horizontal distance between the end of a mask pattern (for example, a photoresist pattern) for etching and the end of an etched pattern is shortened and thus a wiring is not normally formed.

The content of the chlorine-containing compound in weight percent may be about 0.01 wt % to about 5.0 wt %, and more particularly, about 0.1 wt % to about 2.0 wt %, based on the total weight of the etchant composition. When the content of the chlorine-containing compound is less than 0.01 wt %, an effect of improving an etching rate and an effect of reducing a critical dimension (CD) loss cannot be exhibited, and residues may be generated during an etching process. When the content of the chlorine-containing compound is more than 5.0 wt %, the etching rate of a copper layer may excessively increase. For example, when the lower layer of a wiring includes a titanium layer and the upper layer thereof includes a copper layer, the overall CD loss of the wiring may excessively increase.

The inorganic acid may serve as an auxiliary oxidant for a copper component and a titanium component. That is, the inorganic acid may assist the oxidation of a copper layer and a titanium layer. The inorganic acid may include at least one of nitric acid ($HNO_3$), sulfuric acid ($H_2SO_4$), phosphoric acid ($H_3PO_3$), and phosphorous acid ($H_2PO_3$).

The content of the inorganic acid in weight percent may be about 0.5 wt % to about 10.0 wt % based on the total weight of the etchant composition. When the content of the chlorine-containing compound is less than 0.5 wt %, the etching rate for a copper layer or a titanium layer decreases, an etching profile defect or a residue defect may occur. When the content of the chlorine-containing compound is more than 10.0 wt %, the over-etching for a copper layer or a titanium layer may occur. Further, an organic mask pattern used during an etching process, for example, a photosensitive pattern including an organic material is damaged, so as to cause a wiring short-circuit failure.

The organic acid or the organic acid salt may adjust the pH of the etchant composition. Simultaneously, the organic acid or the organic acid salt may maintain the etching rate of a copper layer including a copper component even when the number of wirings to be etched using the etchant composition, that is, the number of wiring substrates to be processed is accumulated to increase the content of impurities in the etchant composition. Examples of the organic acid may include acetic acid ($CH_3COOH$), formic acid ($HCOOH$), propenoic acid ($CH_2=CHCOOH$), butanoic acid ($CH_3(CH_2)_2COOH$), pentanoic acid ($CH_3(CH_2)_3COOH$), gluconic acid ($C_6H_{12}O_7$), glycolic acid ($HOCH_2COOH$), malonic acid ($HOOCCH_2COOH$), oxalic acid ($HOOCCOOH$), benzoic acid ($C_6H_5COOH$), succinic acid ($HOOC(CH_2)_2COOH$), phthalic acid, salicylic acid ($C_7H_6O_3$), lactic acid ($CH_3CH(OH)COOH$), glyceric acid ($HOCH_2CH(OH)COOH$), malic acid ($C_4H_6O_5$), tartaric acid ($C_4H_6O_6$), citric acid ($C_6H_8O_7$), and isocitric acid. As a non-limiting example, the organic acid may be a compound composed of only carbon atoms, hydrogen atoms, and oxygen atoms. The organic acid may form acid ions in an aqueous solution state, and may be an electrically negatively charged compound. The organic acid salt may include a sodium salt, potassium salt or ammonium salt of the organic acid.

The content of the organic acid or the organic acid salt in weight percent may be about 1.0 wt % to about 20.0 wt %, and more particularly, about 1.5 wt % to about 15.0 wt % based on the total weight of the etchant composition. When the content of the organic acid or the organic acid salt is less than 1.0 wt %, sufficient pH control is difficult and thus an etching rate may decrease. When the content of the organic acid or the organic acid salt is more than 20.0 wt %, the over-etching of a wiring is caused, and thus a wiring short-circuit failure may occur.

In some exemplary embodiments, the content of the first amphoteric compound and the content of the organic acid or the organic acid salt, described above, may be in a specific relationship. For example, the weight ratio of the organic acid or the organic acid salt to the first amphoteric compound may be in a range of about 2:1 to about 1:5. When the content of the organic acid or the organic acid salt is more than the above range based on the weight of the first amphoteric compound, an over-etching defect of a copper component may occur. When the content of the organic acid or the organic acid salt is less than the above range based on the weight of the first amphoteric compound, a non-etching effect may occur. This will be described later in detail with experimental examples.

The solvent may be deionized water. In an exemplary embodiment, the solvent may be deionized water having a specific electric resistance or resistivity of 18 MΩ·cm or more. The solvent may constitute the etchant composition other than the solid etchant compositions of the etchant.

In some exemplary embodiments, the etchant composition may further include a copper salt. The copper salt may suppress the initial hunting failure that may occur at the beginning of an etching process as the number of wirings to be etched using the etchant composition, that is, the number of wiring substrates increases. The copper salt may include copper sulfate, copper chloride, or copper nitrate. The content of the copper salt in weight percent may be about 0.01 wt % to about 5.0 wt % based on the total weight of the etchant composition.

Hereinafter, a method of manufacturing a wiring substrate according to the present invention will be described with reference to the accompanying drawings.

FIGS. 1, 2, 3, 4, 5, 6, 7, 8, and 9 are cross-sectional views sequentially illustrating a method of manufacturing a wiring substrate according to an exemplary embodiment of the present invention.

First, referring to FIG. 1, a gate wiring layer 200 and an insulating layer 300 are formed on a substrate 100. In an exemplary embodiment, the gate wiring layer 200 may have a laminate structure of two or more layers, each layers including different materials from each other. For example, the gate wiring layer 200 may include a gate lower metal pattern layer 210 and a gate upper metal pattern layer 220.

The gate lower metal pattern layer 210 includes a metal material having excellent adhesion to the substrate 100, and may be disposed directly on the substrate 100. The gate lower metal pattern layer 210 may be a single layer including titanium or a titanium alloy. The titanium alloy may be an alloy of titanium and a refractory metal such as molybdenum (Mo), tantalum (Ta), chromium (Cr), nickel (Ni) or neodymium (Nd). The thickness of the gate lower metal pattern layer 210 may be about 100 Å to about 300 Å, but the exemplary embodiments are not limited thereto.

The gate upper metal pattern layer 220 may be disposed directly on the gate lower metal pattern layer 210. The gate upper metal pattern layer 220 may include a metal material having low specific electrical resistance and high electrical conductivity. For example, the gate upper metal pattern layer 220 may be a single layer including copper or a copper alloy. The thickness of the gate upper metal pattern layer 210 may be about 3,000 Å to about 6,000 Å, but the exemplary embodiments are not limited thereto.

Although not shown in the drawing, the gate wiring layer 200 including the gate lower metal pattern layer 210 and the gate upper metal pattern layer 220 may include a gate wiring extending in one direction and a gate electrode protruding from the gate wiring.

The insulating layer 300 includes an insulating material, and may insulate the gate wiring layer 200 from components disposed on the insulating layer 300. The insulating layer 300 may cover the upper surface and side surface of the gate wiring layer 200. For example, the insulating layer 300 may be a gate insulating layer that insulates the gate wiring layer 200 from a source/drain wiring layer 500 to be described later. The insulating layer 300 may include an insulating inorganic material such as silicon nitride ($SiN_X$), silicon oxide ($SiO_X$), or silicon oxynitride ($SiN_XO_Y$).

Figure 2:
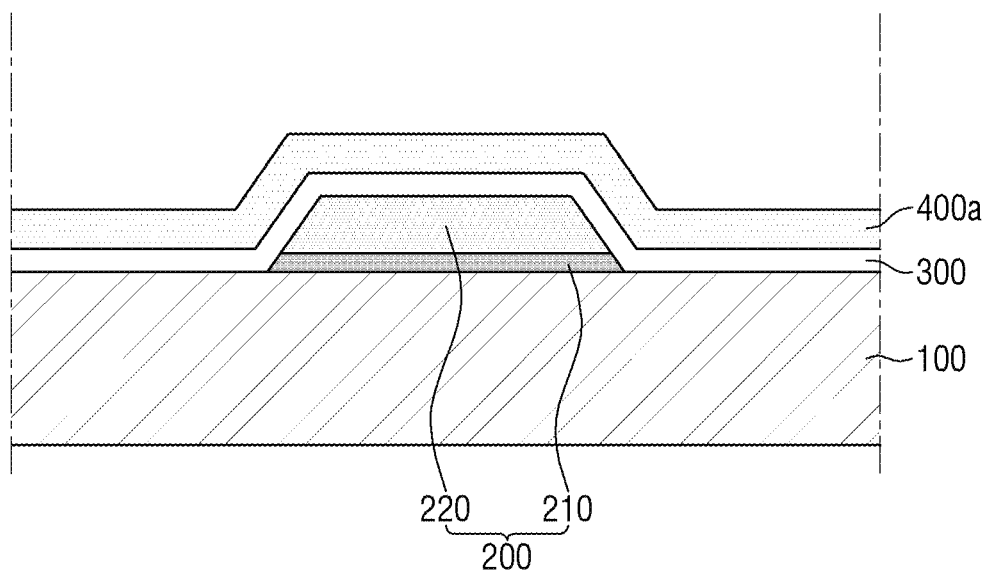

Subsequently, referring to FIGS. 1 and 2, a semiconductor material layer 400a is formed on the insulating layer 300. The semiconductor material layer 400a may include a silicon-based semiconductor material such as amorphous silicon, polycrystalline silicon, or monocrystalline silicon, or may include an oxide semiconductor. Although not shown in the drawing, after the semiconductor material layer 400a is formed, the semiconductor material layer 400a may be doped with n-type impurities.

Figure 3:
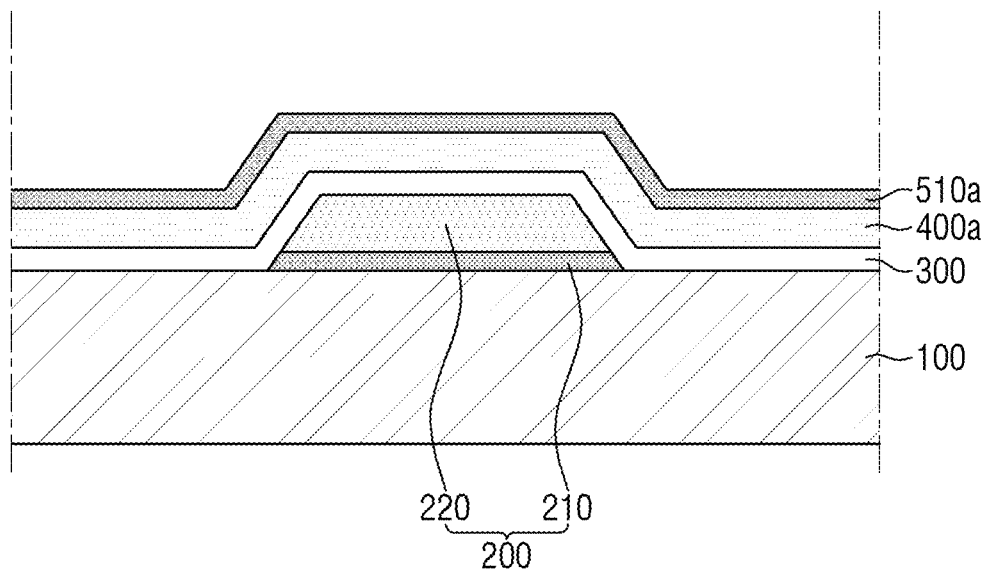
Figure 4:
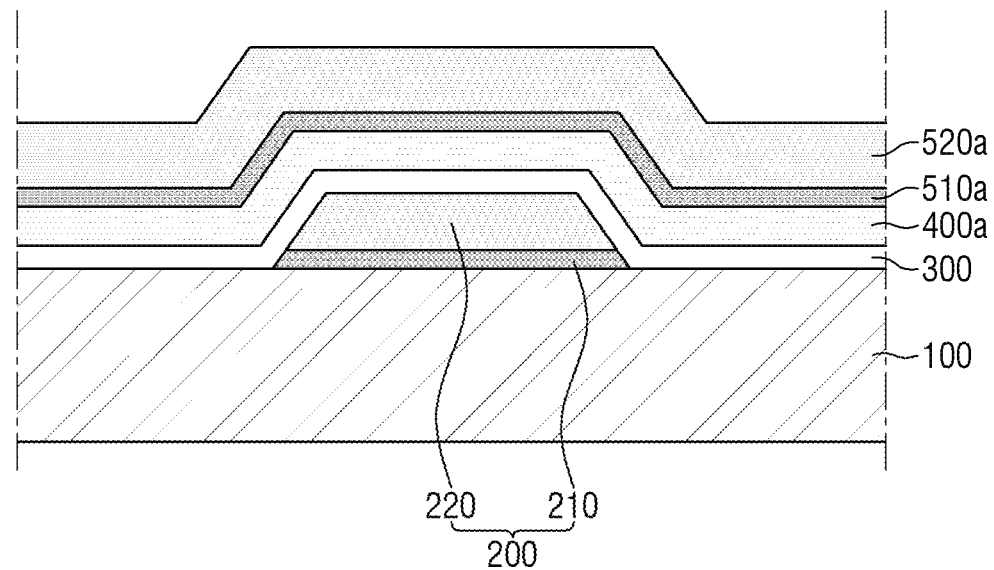
Figure 5:
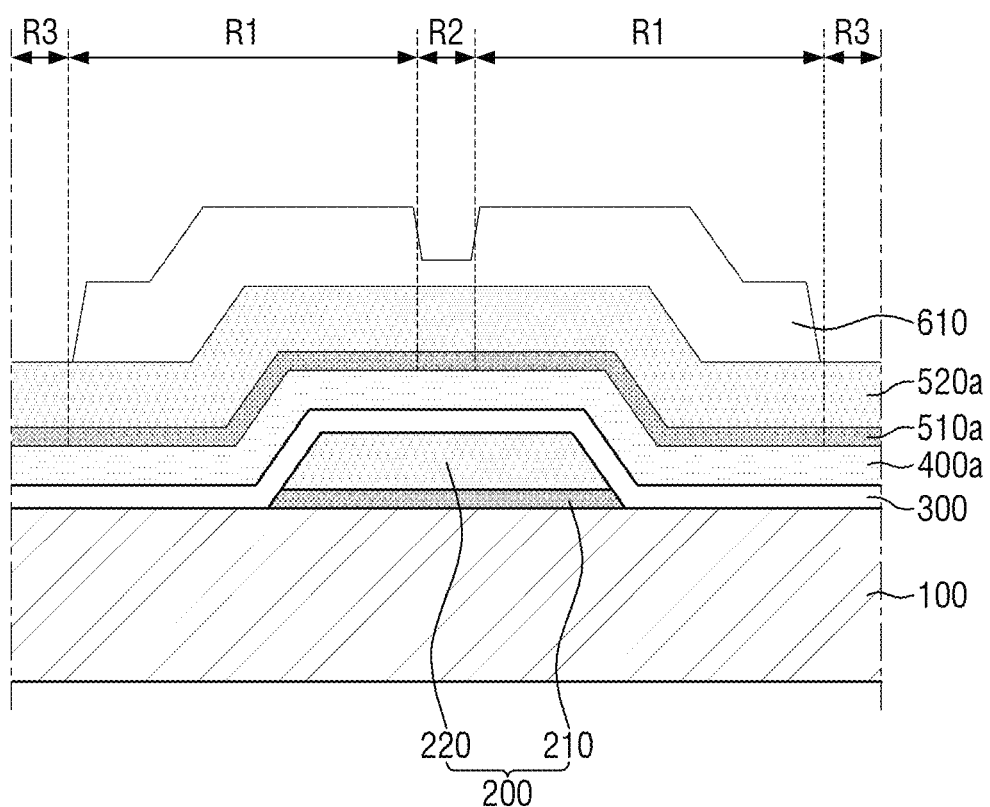
Figure 6:
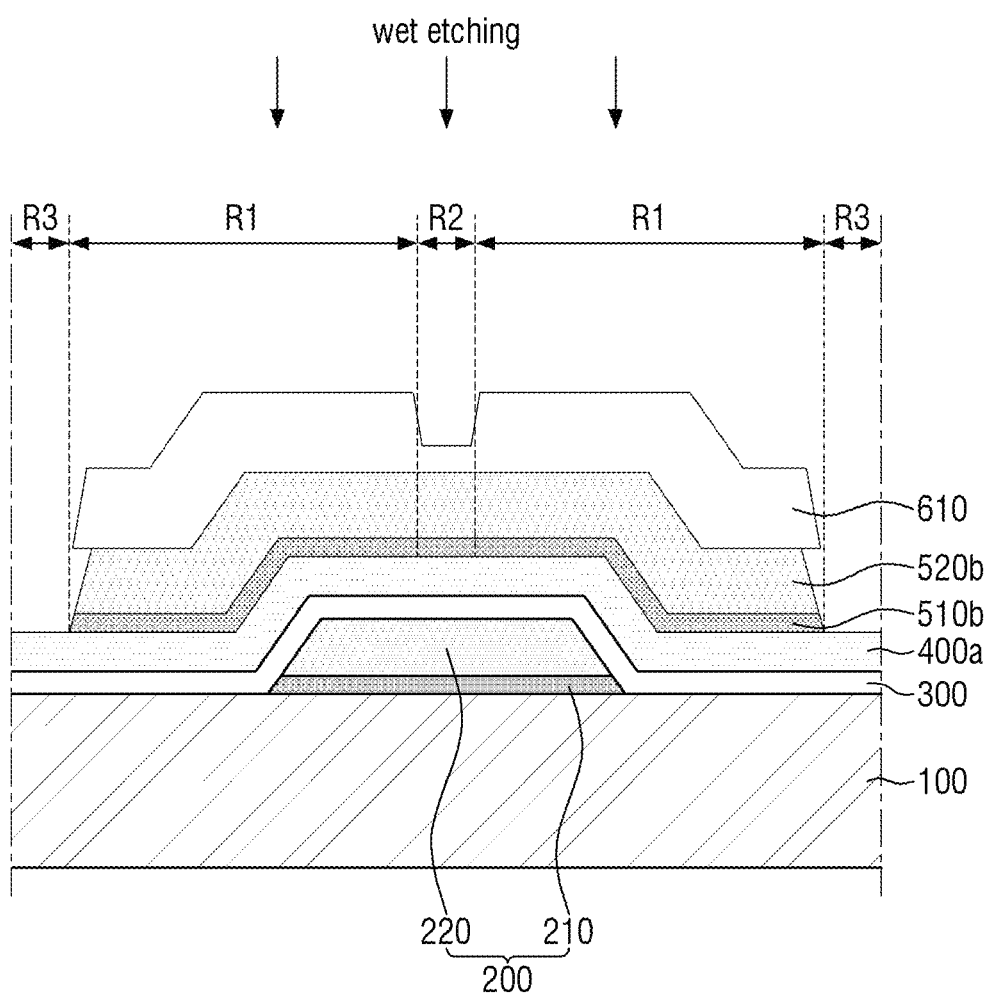
Figure 7:
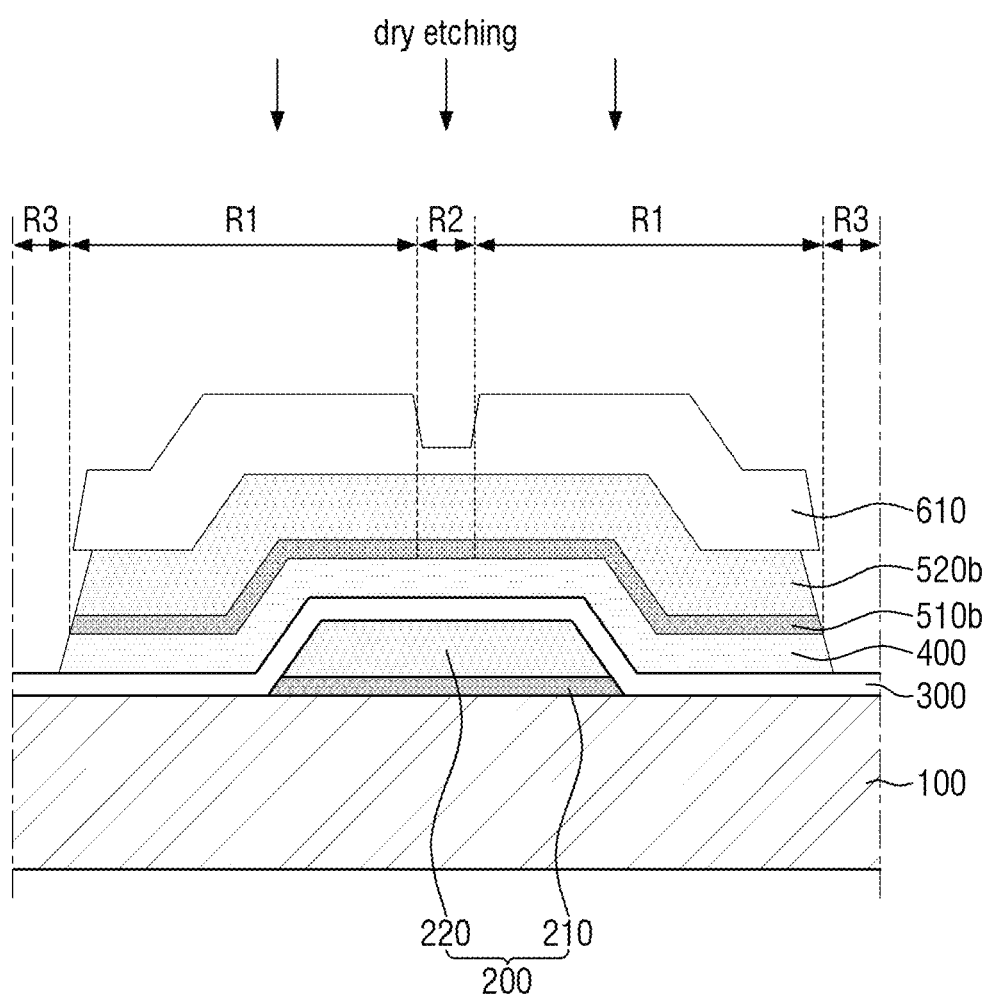
Figure 8:
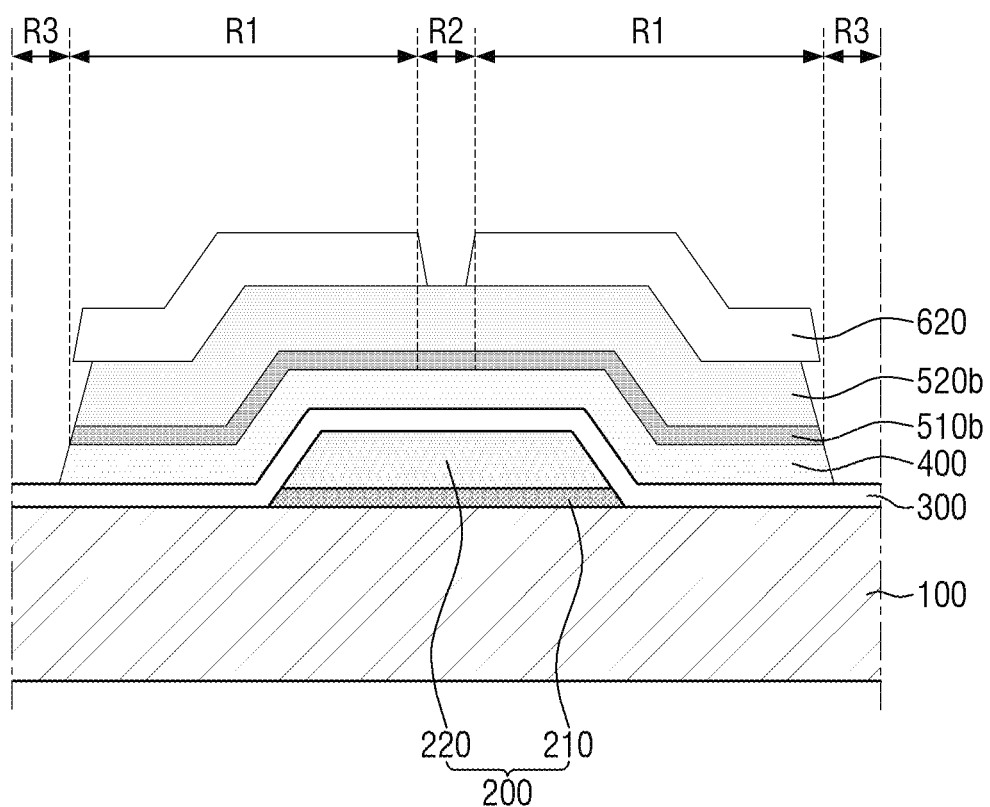
Figure 9:
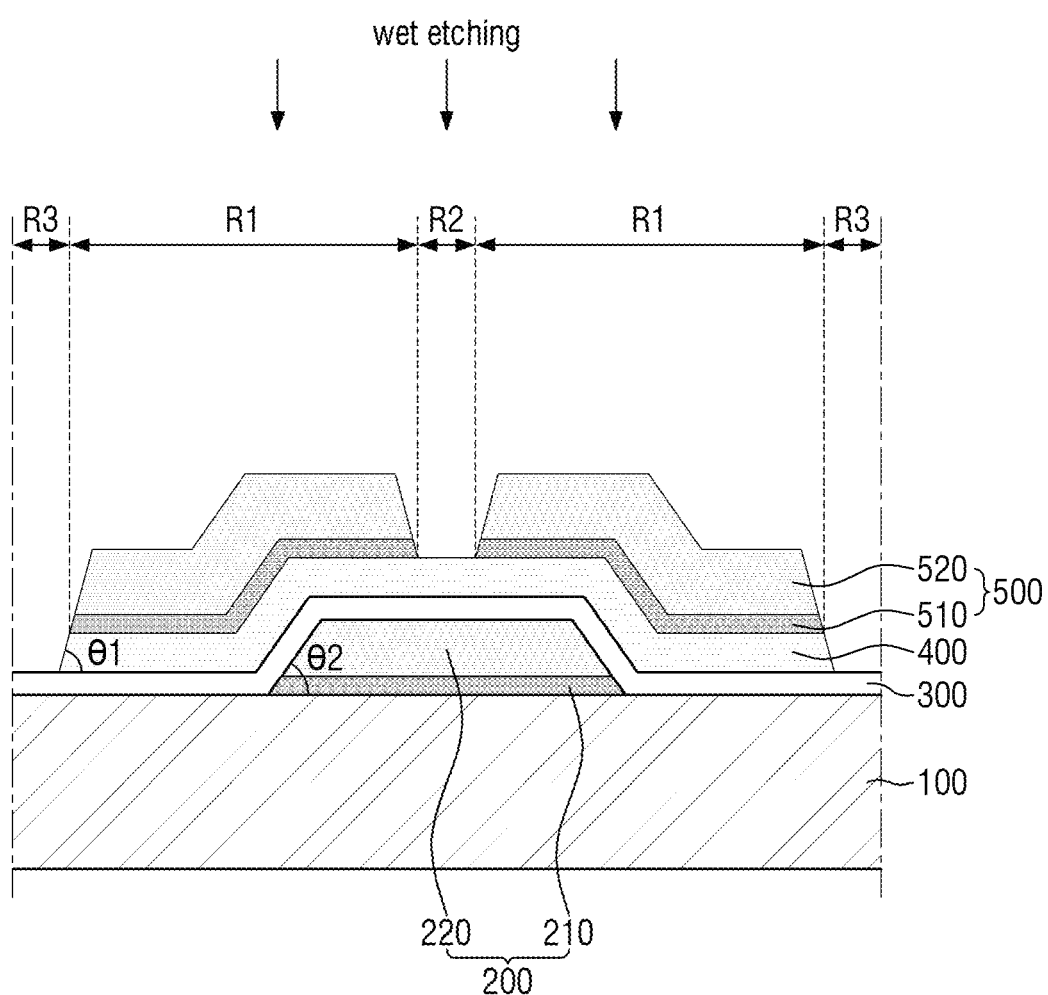

Subsequently, referring to FIGS. 1, 2, and 3, a source/drain lower metal layer 510a is formed on the semiconductor material layer 400a. The source/drain lower metal layer 510a may be a barrier layer that prevents or blocks metal ions in a source/drain upper metal layer 520a, which will be described later, from diffusing into the semiconductor material layer 400a. The source/drain lower metal layer 510a may be a single layer including titanium or a titanium alloy. In some exemplary embodiments, the source/drain lower metal layer 510a may include the same material as the above-described gate lower metal pattern layer 210. The method of forming the source/drain lower metal layer 510a is not particularly limited, and the source/drain lower metal layer 510a may be formed by physical vapor deposition such as sputtering.

Subsequently, referring to FIGS. 1, 2, 3, and 4, a source/drain upper metal layer 520a is formed on the source/drain lower metal layer 510a. The source/drain upper metal layer 520a has lower specific electrical resistance than the source/drain lower metal layer 510a, and may include a metal material having high electrical. For example, the source/drain upper metal layer 520a may be a single layer including copper or a copper alloy. In some exemplary embodiments, the source/drain upper metal layer 520a may include the same material as the above-described gate upper metal pattern layer 220. The method of forming the source/drain upper metal layer 520a is not particularly limited, and the source/drain upper metal layer 520a may be formed by physical vapor deposition such as sputtering. The thickness of the source/drain upper metal layer 520a may be greater than the thickness of the source/drain lower metal layer 510a.

The source/drain lower metal layer 510a and the source/drain upper metal layer 520a may be insulated from the gate wiring layer 200 by the insulating layer 300.

Subsequently, referring to FIGS. 1, 2, 3, 4, and 5, a first mask pattern 610 is formed on the source/drain upper metal layer 520a.

In an exemplary embodiment, the source/drain lower metal layer 510a and the source/drain upper metal layer 520a include a first region R1, a second region R2, and a third region R3. The first mask pattern 610 is formed in the first region R1 and the second region R2, and may not be disposed in the third region R3. That is, the first mask pattern 610 may be formed to expose the third region R3 of the source/drain lower metal layer 510a and the source/drain upper metal layer 520a.

The first mask pattern 610 may have a partially different thickness. In an exemplary embodiment, the thickness of the first mask pattern 610 in the first region R1 of the source/drain lower metal layer 510a and the source/drain upper metal layer 520a may be greater than the thickness of the first mask pattern 610 in the second region R2.

The first mask pattern 610 may include an organic material. For example, the first mask pattern 610 may include a photosensitive organic material. The photosensitive organic material may include a negative photosensitive organic material for partially curing the exposed portion, or a positive photosensitive organic material for partially decomposing the exposed portion. The first mask pattern 610 may be formed such that the thickness of the first mask pattern 610 in the region R1 is greater than the thickness thereof in the region R2 by applying a photosensitive organic material and then partially curing the applied photosensitive organic material in different exposure amounts using a halftone mask or a slit mask, but the exemplary embodiments are not limited thereto.

Subsequently, referring to FIGS. 1, 2, 3, 4, 5, and 6, the source/drain lower metal layer 510a and the source/drain upper metal layer 520a are primarily patterned to form the source/drain lower metal pattern 510b and the source/drain upper metal pattern 520b using the etchant composition. That is, the source/drain lower metal pattern 510b and the source/drain upper metal pattern 520b are formed through a wet etching process using the etchant composition. Since the etchant composition is the above-described etchant composition according to an exemplary embodiment of the present invention, a redundant description will not be omitted.

The third region R3 of the source/drain lower metal layer 510a and the source/drain upper metal layer 520a, not covered by the first mask pattern 610, is primarily etched by the etchant composition and thus removed. The source/drain upper metal layer 520a and the source/drain lower metal layer 510a may be collectively etched and removed together through a single etching process to form the source/drain lower metal pattern 510b and the source/drain upper metal pattern 520b.

On the other hand, the first region R1 and second region R2 of the source/drain lower metal layer 510a and the source/drain upper metal layer 520a, covered by the first mask pattern 610, may be maintained in an unremoved state.

Subsequently, referring to FIGS. 1, 2, 3, 4, 5, 6, and 7, the semiconductor material layer 400a, which is exposed by the source/drain lower metal pattern 510b and the source/drain upper metal pattern 520b formed by partially removing the source/drain lower metal layer 510a and the source/drain upper metal layer 520a without being covered thereby, is partially patterned. In an exemplary embodiment, a semiconductor material pattern layer 400 may be formed through a dry etching process.

Subsequently, referring to FIGS. 1, 2, 3, 4, 5, 6, 7, and 8, the thickness of the first mask pattern 610 is reduced to form a second mask pattern 620. In an exemplary embodiment, the reducing of the thickness of the first mask pattern 610 includes forming the second mask pattern 620 through an ashing process or a dry etching process.

The second mask pattern 620 remains in the first region R1 of the source/drain lower metal pattern 510b and the source/drain upper metal pattern 520b, and may not remain in the second region R2 thereof. That is, the second mask pattern 620 may be formed to expose the second region R2 of the source/drain lower metal pattern 510b and the source/drain upper metal pattern 520b. The reason for this is that the first mask pattern 610 has a partially different thickness and the thickness of the first mask pattern 610 is substantially uniformly reduced, but the exemplary embodiments are not limited thereto.

Subsequently, referring to FIGS. 1, 2, 3, 4, 5, 6, 7, 8, and 9, the source/drain lower metal pattern 510b and the source/drain upper metal pattern 520b are secondarily patterned using the etchant composition. That is, the source/drain lower metal pattern 510b and the source/drain upper metal pattern 520b are formed through a wet etching process using an etchant composition to form a source/drain lower metal pattern layer 510 and a source/drain upper metal pattern layer 520. This etchant composition used in the secondary patterning may be the same as the etchant composition used in the primary patterning.

The second region R2 of the source/drain lower metal pattern 510b and the source/drain upper metal pattern 520b, not covered by the second mask pattern 620, is secondarily etched by the etchant composition and thus removed. The source/drain upper metal pattern 520b and the source/drain lower metal pattern 510b may be collectively etched and removed together through a single etching process.

In contrast, the first region R1 of the source/drain lower metal pattern 510b and the source/drain upper metal pattern 520b, covered by the second mask pattern 620, may be maintained in an unremoved state. Thus, a source/drain wiring layer 500 including the source/drain lower metal pattern layer 510 and the source/drain upper metal pattern layer 520 spaced apart from each other may be formed on the semiconductor material pattern layer 400.

In some exemplary embodiments, the side inclination angle θ1 of the source/drain wiring layer 500 may be larger than the side inclination angle θ2 of the gate wiring layer 200. For example, the side inclination angle θ1 of the source/drain wiring layer 500 may be about 55° to about 80°. When the side inclination angle θ2 of the gate wiring layer 200 is relatively small, it is possible to the coverage characteristics of components laminated on the gate wiring layer 200, for example, the insulating layer 300, the semiconductor material pattern layer 400, and the source/drain wiring layer 500.

of the source/drain wiring layer 500 is in a range of about 55° to about 80°, and thus the coverage characteristics of components laminated on the source/drain wiring layer 500 may be improved.

Hereinafter, the exemplary embodiments will be described in more detail with reference to Exemplary Etchant, Comparative Etchant, and Experimental Examples.

Table 1 lists the compositions of 14 Exemplary Etchants Pre. Ex. 1, 2, 3, 4, 5, 6, 7, 8, 9, 10, 11, 12, 13, and 14. The Exemplary Etchants Pre. Ex. 1, 2, 3, 4, 5, 6, 7, 8, 9, 10, 11, 12, 13, and 14 Table 1 also lists the compositions of 9 Comparative Etchants Comp. Ex. 1, 2, 3, 4, 5, 6, 7, 8, and 9. The numbers in the table represent the weight percentages of the corresponding components.

TABLE 1

|  | SPS | ABF | ACl | ATZ | HNO$_3$ | AcOH | Gly | IDA | SFA | BSFA | MSFA | DIW |
|---|---|---|---|---|---|---|---|---|---|---|---|---|
| Pre. Ex. 1 | 10.0 | 0.5 | 1.0 | 1.0 | 3.0 | 3.0 | 0.2 | — | 1.5 | — | — | balance |
| Pre. Ex. 2 | 10.0 | 0.5 | 1.0 | 1.0 | 3.0 | 3.0 | 0.5 | — | 1.5 | — | — | balance |
| Pre. Ex. 3 | 10.0 | 0.5 | 1.0 | 1.0 | 3.0 | 3.0 | 1.5 | — | 1.5 | — | — | balance |
| Pre. Ex. 4 | 10.0 | 0.5 | 1.0 | 1.0 | 3.0 | 3.0 | 4.0 | — | 1.5 | — | — | balance |
| Pre. Ex. 5 | 10.0 | 0.5 | 1.0 | 1.0 | 3.0 | 3.0 | 1.0 | — | 0.2 | — | — | balance |
| Pre. Ex. 6 | 10.0 | 0.5 | 1.0 | 1.0 | 3.0 | 3.0 | 1.0 | — | 0.5 | — | — | balance |
| Pre. Ex. 7 | 10.0 | 0.5 | 1.0 | 1.0 | 3.0 | 3.0 | 1.0 | — | 1.0 | — | — | balance |
| Pre. Ex. 8 | 10.0 | 0.5 | 1.0 | 1.0 | 3.0 | 3.0 | 1.0 | — | 3.0 | — | — | balance |
| Pre. Ex. 9 | 10.0 | 0.5 | 1.0 | 1.0 | 3.0 | 3.0 | 1.0 | — | 5.0 | — | — | balance |
| Pre. Ex. 10 | 10.0 | 0.5 | 1.0 | 1.0 | 3.0 | 3.0 | 1.0 | — | 6.0 | — | — | balance |
| Pre. Ex. 11 | 10.0 | 0.5 | 1.0 | 1.0 | 3.0 | 0.5 | 1.0 | — | 1.5 | — | — | balance |
| Pre. Ex. 12 | 10.0 | 0.5 | 1.0 | 1.0 | 3.0 | 4.0 | 1.0 | — | 1.5 | — | — | balance |
| Pre. Ex. 13 | 10.0 | 0.5 | 1.0 | 1.0 | 2.0 | 8.0 | 1.0 | — | 1.5 | — | — | balance |
| Pre. Ex. 14 | 10.0 | 0.5 | 1.0 | 1.0 | 2.0 | 13.0 | 1.0 | — | 1.5 | — | — | balance |
| Comp. Ex. 1 | 10.0 | 0.5 | 1.0 | 1.0 | 3.0 | 3.0 | — | — | 1.5 | — | — | balance |
| Comp. Ex. 2 | 10.0 | 0.5 | 1.0 | 1.0 | 3.0 | 3.0 | 11.0 | — | 1.5 | — | — | balance |
| Comp. Ex. 3 | 10.0 | 0.5 | 1.0 | 1.0 | 3.0 | 3.0 | 1.0 | — | — | — | — | balance |
| Comp. Ex. 4 | 10.0 | 0.5 | 1.0 | 1.0 | 3.0 | 3.0 | 1.0 | — | 8.0 | — | — | balance |
| Comp Ex. 5 | 10.0 | 0.5 | 1.0 | 1.0 | 3.0 | — | 1.0 | — | 1.5 | — | — | balance |
| Comp. Ex. 6 | 10.0 | 0.5 | 1.0 | 1.0 | 3.0 | 22.0 | 1.0 | — | 1.5 | — | — | balance |
| Comp. Ex. 7 | 10.0 | 0.5 | 1.0 | 1.0 | 3.0 | 3.0 | — | 1.5 | 1.5 | — | — | balance |
| Comp Ex. 8 | 10.0 | 0.5 | 1.0 | 1.0 | 3.0 | 3.0 | 1.0 | — | — | 2.0 | — | balance |
| Comp. Ex. 9 | 10.0 | 0.5 | 1.0 | 1.0 | 3.0 | 3.0 | 1.0 | — | — | — | 2.0 | balance |

The etchant composition according to the present exemplary embodiment has excellent batch etching characteristics for the source/drain wiring pattern layer 500 including the source/drain lower metal pattern layer 510 and the source/drain upper metal pattern layer 520. Therefore, the source/drain wiring layer 500 having a good profile may be formed. For example, the etchant composition may have etching characteristics such that the side inclination angle θ1

Referring to the Table 1 above, SPS refers to sodium peroxodisulfate, ABF refers to ammonium fluoride, ACl refers to ammonium chloride, ATZ refers to 5-aminotetrazole, HNO$_3$ refers to nitric acid, and AcOH refers to acetic acid. Gly refers to glycine represented by the above-mentioned Formula Ia, and IDA refers to iminodiacetic acid. Here, the iminodiacetic acid is provided as a control group of glycine in order to confirm the function of glycine. SFA refers to sulfonic acid represented by the above-mentioned formula IIa, BSFA refers to benzosulfonic acid, and MSFA refers to methanesulfonic acid. Here, the benzosulfonic acid and the methanesulfonic acid are provided as a control group of sulfonic acid in order to confirm the function of sulfonic acid. DIW refers to deionized water.

Exemplary Experiment 1

According to a first exemplary experiment, a titanium alloy layer was deposited on a glass substrate having a size of 100 mm×100 mm, and a copper layer was deposited on the titanium alloy layer. A photosensitive material layer having a predetermined pattern was formed on the copper layer, and then the copper layer and the titanium alloy layer were patterned using the Exemplary Etchants Pre. Ex. 1, 2, 3, 4, 5, 6, 7, 8, 9, 10, 11, 12, 13, and 14 and the Comparative Etchants Comp. Ex. 1, 2, 3, 4, 5, 6, 7, 8, and 9.

Exemplary experiment 1 was carried out using an etching machine, such as ETCHER (TFT) which is a model number of an injection etching machine manufactured by SEMES® Corporation as experimental equipment, and the temperature of the etchant composition was maintained at about 28° C. during an etching process. The etching time was in a range of 50 seconds to 200 seconds in consideration of process conditions and other factors. The profiles of the patterned copper layer and the patterned titanium alloy layer were measured using a scanning electron microscope (or SEM), such as SEM S-4700 which is a model number of a SEM manufactured by HITACHI® Corporation.

The etching rates (Å/sec) of the patterned copper layer and the patterned titanium alloy layer and the profiles of the patterned wiring were measured, and the results of the first exemplary experiment are listed in Table 2 below.

Experimental Example 2

According to a second exemplary experiment, 3,000 ppm of copper was dissolved in the etchant compositions of the Exemplary Etchants Pre. Ex. 1, 2, 3, 4, 5, 6, 7, 8, 9, 10, 11, 12, 13, and 14 and the Comparative Etchant Comp. Ex. 1, 2, 3, 4, 5, 6, 7, 8, and 9, stored at a low temperature of −8° C., and observed whether copper precipitates are formed. The results of the second exemplary experiment are listed in Table 2 below.

Experimental Example 3

According to a third exemplary experiment, Silicon was immersed in the etchant compositions of the Exemplary Etchants Pre. Ex. 1, 2, 3, 4, 5, 6, 7, 8, 9, 10, 11, 12, 13, and 14 and the Comparative Etchant Comp. Ex. 1, 2, 3, 4, 5, 6, 7, 8, and 9 at 23° C. for 3 hours, and then the degree of generation of precipitates was observed by filtering and drying the etchant compositions, and the results of the third exemplary experiment are listed in Table 2 below.

TABLE 2

| | Experiment 1 Etching rate (Å/sec) | Experiment 2 Copper component precipitates | Experiment 3 Silicon component precipitates | Profile |
|---|---|---|---|---|
| Pre. Ex. 1 | ○ | Δ | ○ | |
| Pre. Ex. 2 | ○ | ○ | ○ | |
| Pre. Ex. 3 | ○ | ○ | ○ | |
| Pre. Ex. 4 | Δ | Δ | ○ | |
| Pre. Ex. 5 | ○ | Δ | ○ | |
| Pre. Ex. 6 | ○ | ○ | ○ | |
| Pre. Ex. 7 | ○ | ○ | ○ | |
| Pre. Ex. 8 | ○ | ○ | ○ | |
| Pre. Ex. 9 | ○ | ○ | ○ | |
| Pre. Ex. 10 | Δ | ○ | Δ | |
| Pre. Ex. 11 | ○ | ○ | ○ | |
| Pre. Ex. 12 | ○ | ○ | ○ | |
| Pre. Ex. 13 | ○ | ○ | ○ | |
| Pre. Ex. 14 | ○ | ○ | ○ | |
| Comp. Ex. 1 | ○ | x | ○ | |
| Comp. Ex. 2 | x | x | ○ | Copper layer non-etched |
| Comp. Ex. 3 | ○ | ○ | Δ | |
| Comp. Ex. 4 | x | ○ | Δ | Copper layer over-etched |
| Comp. Ex. 5 | Δ | ○ | ○ | Copper layer non-uniformly etched |
| Comp. Ex. 6 | x | ○ | ○ | Copper layer over-etched |
| Comp. Ex. 7 | ○ | x | ○ | |
| Comp. Ex. 8 | ○ | ○ | x | Excessive silicon precipitates |
| Comp. Ex. 9 | ○ | ○ | x | Excessive silicon precipitates |

In the first column of Table 2 above corresponding to the exemplary experiment 1, a symbol '○' represents an etching rate of equal to or between 200 Å/sec and 300 Å/sec, a symbol 'Δ' represents an etching rate of less than 200 Å/sec or more than 300 Å/sec, and a symbol 'x' represents occurrence of non-etching failure or over-etching failure.

In the second column of Table 2 above corresponding to the exemplary experiment 2, a symbol '○' represents copper component precipitates not being generated for 90 days, a symbol 'Δ' represents case where copper component precipitates being generated between 60 days to 90 days, and a symbol 'x' represents copper component precipitates being generated before 60 days. It is means that the solubility of a copper component is not sufficient as the period of generation of copper component precipitates decreases, and the number of wiring substrates to be processed may be reduced because the copper component acts as impurities.

In the third column of Table 2 above corresponding to the exemplary experiment 3, the symbol '○' represents the amount of silicon component precipitates generated being less than 1.2 g, the symbol 'Δ' represents the amount of silicon component precipitates generated being equal or between 1.2 g to 2.0 g, and the symbol 'x' represents the amount of silicon component precipitates generated being more than 2.0 g is. It is means that the dissolution characteristics of a silicon component are not sufficient as the amount of generation of silicon component precipitates increases, and the silicon component may act as impurities.

Referring to Table 2 above, the etchant composition of Comparative Etchant Comp. Ex. 1 not including the first amphoteric compound (glycine) and the etchant composition of Comparative Etchants Comp. Ex. 2 including 11.0 wt % of the first amphoteric compound may be vulnerable to copper component precipitation. Particularly, in the case of the etchant composition of Comparative Etchant Comp. Ex. 2 where the content of the first amphoteric compound is greater than the content of peroxydisulfate, the etching rate thereof may be very low, and non-etching failure occurs.

Further, the etchant composition of Comparative Etchants Comp. Ex. 3 not including the second amphoteric compound (sulfonic acid) and the etchant composition of Comparative Etchants Comp. Ex. 4 including 8.0 wt % of the second amphoteric compound may be vulnerable to silicon component precipitation. Particularly, in the case of the etchant composition of Comparative Etchants Comp. Ex. 4, the etching rate thereof may be very low, and non-etching failure occurs.

Further, the etchant composition of Comparative Etchant Comp. Ex. 5 not including the organic acid (acetic acid) and the etchant composition of Comparative Etchant Comp. Ex. 6 including 22.0 wt % of the organic acid may have etching characteristics poor and thus non-uniform etching failure or over-etching failure occurs. Particularly, in the case of the etchant composition of Comparative Etchant Comp. Ex. 6, the etching rate thereof may be very low.

The etchant composition of Comparative Etchant Comp. Ex. 7 including iminodiacetic acid instead of the first amphoteric compound (glycine may be vulnerable to copper component precipitation.

The etchant composition of Comparative Etchant Comp. Ex. 8 including benzesulfonic acid instead of the second amphoteric compound (sulfonic acid) and the etchant composition of Comparative Etchant Comp. Ex. 9 including methanesulfonic acid may be very excessively precipitated.

Meanwhile, Table 2 shows that, among the etchant compositions of the Exemplary Etchants Pre. Ex. 1, 2, 3, 4, 5, 6, 7, 8, 9, 10, 11, 12, 13, and 14, the etchant composition satisfying the condition that the weight ratio of the first amphoteric compound to the second amphoteric compound is equal to or between 2:1 to 1:5 exhibits more stable etching characteristics as compared with the etchant composition not satisfying the above condition. Further, Table 2 shows that the etchant composition of Comparative Etchant Comp. Ex. 6 including an excess amount of an organic acid or an organic acid salt based on the content of the first amphoteric compound contributing to the stabilization of a profile may cause an over-etching failure and the etchant composition of Comparative Etchant Comp. Ex. 2 including an extremely small amount of an organic acid or an organic acid salt may cause an non-etching failure. The reason for this is that the first amphoteric compound and the organic acid or the organic acid salt perform different functions from each other, but the exemplary embodiments are not limited thereto.

Exemplary Experiment 4

According to a fourth exemplary experiment, a copper layer and a titanium alloy layer were patterned using the etchant compositions of the Exemplary Etchants Pre. Ex. 1, 2, 3, 4, 5, 6, 7, 8, 9, 10, 11, 12, 13, and 14 and Comparative Etchant Comp. Ex. 1, 2, 3, 4, 5, 6, 7, 8, and 9 under the same conditions as Exemplary Experiment 1.

Processes of recovering the etchant composition having been used in the etching and then patterning a copper layer and a titanium alloy layer under the same conditions as Experimental Example 1 were repeated.

In this case, the taper angles of the copper layer according to the number of repetitions were measured, and the results thereof are listed in Table 3 below. Further, the profiles of the titanium alloy layer were measured, and the results thereof are listed in Table 4 below. Specifically, the lengths of the protruding tail portions of the titanium alloy layer were measured, and the results thereof are listed in Table 4 below. Further, the degree of lateral etching of the copper layer, specifically the etch depth of the copper layer, were measured, and the results thereof are listed in Table 5 below.

In Tables 3, 4, and 5 below, the symbol 'X' represents a case where the tapered side of a pattern collapses and thus the profile of the pattern cannot be measured.

Further, in Tables 3, 4, and 5 below, the 'ppm' refers to a concentration of copper ions in the etchant composition. That is, the 'ppm' refers to a concentration of copper ions in the etchant composition that is increased as the etchant composition is repeatedly recovered and used in the etching process. In other words, 0 ppm refers to the initial etchant composition having no history used in the etching process. As the concentration (ppm) increases, the content of impurities in the etchant composition increases according to the repetitive use in the etching process.

TABLE 3

|  | 0 ppm | 1,000 ppm | 2,000 ppm | 3,000 ppm | 4,000 ppm | 5,000 ppm | 6,000 ppm |
|---|---|---|---|---|---|---|---|
| Pre. Ex 1 | 65° | 63° | 66° | 66° | 67° | 69° | x |
| Pre. Ex 2 | 63° | 63° | 63° | 64° | 65° | 67° | x |
| Pre. Ex. 3 | 59° | 59° | 59° | 59° | 59° | 59° | x |
| Pre. Ex. 4 | 54° | 54° | 54° | 54° | 54° | 54° | x |
| Pre. Ex. 5 | 57° | 54° | 54° | 54° | 54° | 54° | x |
| Pre. Ex. 6 | 57° | 54° | 54° | 54° | 54° | 54° | x |
| Pre. Ex. 7 | 58° | 58° | 58° | 58° | 58° | 59° | x |
| Pre. Ex. 8 | 59° | 59° | 59° | 59° | 59° | 59° | 62° |
| Pre. Ex. 9 | 60° | 60° | 61° | 61° | 61° | 61° | x |
| Pre. Ex. 10 | 60° | 60° | 61° | 62° | 63° | 63° | x |
| Pre. Ex. 11 | 57° | 54° | 54° | 54° | 54° | 54° | x |
| Pre. Ex. 12 | 57° | 54° | 54° | 54° | 54° | 54° | x |
| Pre. Ex. 13 | 58° | 58° | 58° | 58° | 58° | 59° | x |
| Pre. Ex. 14 | 60° | 60° | 60° | 60° | 60° | 60° | x |
| Comp. Ex. 1 | 66° | 67° | 69° | 76° | 81° | 79° | x |
| Comp. Ex. 2 | non-etched | non-etched | non-etched | non-etched | non-etched | non-etched | non-etched |
| Comp. Ex. 3 | 58° | 58° | 58° | 58° | x | x | x |
| Comp. Ex. 4 | over-etched | over-etched | over-etched | over-etched | over-etched | over-etched | over-etched |
| Comp. Ex. 7 | 60° | 62° | 63° | 66° | 71° | 72° | x |
| Comp. Ex. 8 | 60° | 60° | 60° | 61° | x | x | x |
| Comp. Ex. 9 | 71° | 71° | 72° | 73° | 77° | 82° | x |

In Table 3 above, it means that the number of wiring substrates to be processed increases and excellent etching characteristics are exhibited as the difference between the taper angle of a pattern using the initial etchant composition (that is, 0 ppm) and the taper angle of the pattern using the etchant composition having a high copper ion concentration decreases.

Referring to Table 3, it can be found that, in all of the etchant compositions of the Exemplary Etchants Pre. Ex. 1, 2, 3, 4, 5, 6, 7, 8, 9, 10, 11, 12, 13, and 14 and the Comparative Etchants Comp. Ex. 1, 2, 3, 4, 5, 6, 7, 8, and 9, the taper angle of the pattern tends to increase with the increase in the concentration of copper ions.

First, in the case of the etchant compositions of The Exemplary Etchants Pre. Ex. 1, 2, 3, 4, 5, 6, 7, 8, 9, 10, 11, 12, 13, and 14 each including both the first amphoteric compound (glycine) and the second amphoteric compound (sulfonic acid), it can be found that there is no great difference between the taper angle of the pattern obtained by performing an etching process using the initial etchant composition and the taper angle of the pattern obtained by performing an etching process using the etchant composition including copper ions at a concentration of 5,000 ppm.

In contrast, in the case of the etchant composition of Comparative Etchant Comp. Ex. 2 including 11.0 wt % of the first amphoteric compound and the etchant composition of Comparative Etchant Comp. Ex. 4 including 8.0 wt % of the second amphoteric compound, each copper layer may not be etched or is over-etched.

Further, in the case of the etchant compositions of Comparative Etchants Comp. Ex. 1 and 7 each not including the first amphoteric compound and the etchant composition of Comparative Etchant Comp. Ex. 9 not including the second amphoteric compound, the taper angle of the pattern obtained by performing an etching process using the etchant composition including copper ions at a concentration of 5,000 ppm may be increased by about 10° or more compared to the taper angle of the pattern obtained by performing an etching process using the initial etchant composition.

Further, in the case of the etchant compositions of Comparative Etchant Comp. Ex. 3 and 8 each not including the second amphoteric compound, as the number of wiring substrates to be processed increases, specifically, when the concentration of copper ion was more than 4,000 ppm, the slope of the taper collapses and thus measurement is impossible.

That is, in the case of the etchant compositions of the Exemplary Etchants Pre. Ex. 1, 2, 3, 4, 5, 6, 7, 8, 9, 10, 11, 12, 13, and 14 each including both the first amphoteric compound and the second amphoteric compound, the number of processable wiring substrates may be increased and optimal taper angle may be formed, as compared with the etchant compositions of Comparative Etchants Comp. Ex. 1, 2, 3, 4, 7, 8, and 9 each not including any one of the first amphoteric compound and the second amphoteric compound and the etchant compositions of Comparative Etchants Comp. Ex. 1, 2, 3, 4, 7, 8, and 9 each including an extremely large amount of the first amphoteric compound and the second amphoteric compound.

TABLE 4

|  | 0 ppm | 1,000 ppm | 2,000 ppm | 3,000 ppm | 4,000 ppm | 5,000 ppm | 6,000 ppm |
|---|---|---|---|---|---|---|---|
| Pre. Ex 1 | 0.11 μm | 0.11 μm | 0.11 μm | 0.11 μm | 0.12 μm | 0.13 μm | x |
| Pre. Ex 2 | 0.11 μm | 0.11 μm | 0.11 μm | 0.11 μm | 0.11 μm | 0.12 μm | x |
| Pre. Ex. 3 | 0.11 μm | 0.11 μm | 0.11 μm | 0.11 μm | 0.11 μm | 0.11 μm | x |
| Pre. Ex. 4 | 0.11 μm | 0.11 μm | 0.11 μm | 0.11 μm | 0.11 μm | 0.11 μm | x |
| Pre. Ex. 5 | 0.11 μm | 0.11 μm | 0.11 μm | 0.11 μm | 0.11 μm | 0.11 μm | x |
| Pre. Ex. 6 | 0.11 μm | 0.11 μm | 0.11 μm | 0.11 μm | 0.11 μm | 0.11 μm | x |
| Pre. Ex. 7 | 0.11 μm | 0.11 μm | 0.11 μm | 0.11 μm | 0.11 μm | 0.11 μm | x |
| Pre. Ex. 8 | 0.11 μm | 0.11 μm | 0.11 μm | 0.11 μm | 0.11 μm | 0.11 μm | 0.13 μm |
| Pre. Ex. 9 | 0.11 μm | 0.11 μm | 0.11 μm | 0.11 μm | 0.11 μm | 0.11 μm | x |
| Pre. Ex. 10 | 0.11 μm | 0.11 μm | 0.11 μm | 0.11 μm | 0.11 μm | 0.11 μm | x |
| Pre. Ex. 11 | 0.11 μm | 0.11 μm | 0.11 μm | 0.11 μm | 0.11 μm | 0.11 μm | x |
| Pre. Ex. 12 | 0.11 μm | 0.11 μm | 0.11 μm | 0.11 μm | 0.11 μm | 0.11 μm | x |
| Pre. Ex. 13 | 0.11 μm | 0.11 μm | 0.11 μm | 0.11 μm | 0.11 μm | 0.11 μm | x |
| Pre. Ex. 14 | 0.11 μm | 0.11 μm | 0.11 μm | 0.11 μm | 0.11 μm | 0.11 μm | x |
| Comp. Ex. 1 | 0.11 μm | 0.11 μm | 0.12 μm | 0.13 μm | 0.16 μm | 0.21 μm | x |
| Comp. Ex. 2 | non-etched | non-etched | non-etched | non-etched | non-etched | non-etched | non-etched |
| Comp. Ex. 7 | 0.11 μm | 0.11 μm | 0.12 μm | 0.13 μm | 0.16 μm | 0.22 μm | x |

Referring to Table 4 above, in the case of the etchant compositions of the Exemplary Etchants Pre. Ex. 1, 2, 3, 4, 5, 6, 7, 8, 9, 10, 11, 12, 13, and 14 each including 0.01 wt % to 10.0 wt % of the first amphoteric compound (glycine), it can be found that the profile of the titanium alloy layer is good.

In contrast, in the case of the etchant composition of the Comparative Etchant Comp. Ex. 2 including 11.0 wt % of the first amphoteric compound, the copper layer may not be etched.

Further, in the case of the etchant compositions of the Comparative Etchants Comp. Ex. 1 and 7 each not including the first amphoteric compound, the profile of the titanium alloy layer rapidly becomes poor with the increase in the number of wiring substrates to be processed.

That is, in the case of the etchant compositions of the Exemplary Etchants Pre. Ex. 1, 2, 3, 4, 5, 6, 7, 8, 9, 10, 11, 12, 13, and 14 each including about 0.01 wt % to 10.0 wt % of the first amphoteric compound, the profile of the titanium alloy layer may be improved as compared with the etchant compositions each not including the first amphoteric compound.

TABLE 5

|  | 0 ppm | 1,000 ppm | 2,000 ppm | 3,000 ppm | 4,000 ppm | 5,000 ppm | 6,000 ppm |
|---|---|---|---|---|---|---|---|
| Pre. Ex 1 | 0.75 μm | 0.75 μm | 0.75 μm | 0.75 μm | 0.75 μm | 0.75 μm | 0.68 μm |
| Pre. Ex 2 | 0.75 μm | 0.75 μm | 0.75 μm | 0.75 μm | 0.75 μm | 0.75 μm | 0.68 μm |

TABLE 5-continued

| | 0 ppm | 1,000 ppm | 2,000 ppm | 3,000 ppm | 4,000 ppm | 5,000 ppm | 6,000 ppm |
|---|---|---|---|---|---|---|---|
| Pre. Ex. 3 | 0.75 μm | 0.75 μm | 0.75 μm | 0.75 μm | 0.75 μm | 0.75 μm | 0.68 μm |
| Pre. Ex. 4 | 0.75 μm | 0.75 μm | 0.75 μm | 0.75 μm | 0.75 μm | 0.74 μm | 0.69 μm |
| Pre. Ex. 5 | 0.75 μm | 0.75 μm | 0.75 μm | 0.75 μm | 0.75 μm | 0.75 μm | 0.68 μm |
| Pre. Ex. 6 | 0.75 μm | 0.75 μm | 0.75 μm | 0.75 μm | 0.75 μm | 0.75 μm | 0.68 μm |
| Pre. Ex. 7 | 0.75 μm | 0.75 μm | 0.75 μm | 0.75 μm | 0.75 μm | 0.75 μm | 0.68 μm |
| Pre. Ex. 8 | 0.75 μm | 0.75 μm | 0.75 μm | 0.75 μm | 0.75 μm | 0.75 μm | 0.68 μm |
| Pre. Ex. 9 | 0.75 μm | 0.75 μm | 0.75 μm | 0.75 μm | 0.75 μm | 0.75 μm | 0.68 μm |
| Pre. Ex. 10 | 0.75 μm | 0.75 μm | 0.75 μm | 0.75 μm | 0.75 μm | 0.75 μm | 0.70 μm |
| Pre. Ex. 11 | 0.75 μm | 0.75 μm | 0.75 μm | 0.75 μm | 0.75 μm | 0.75 μm | 0.68 μm |
| Pre. Ex. 12 | 0.75 μm | 0.75 μm | 0.75 μm | 0.75 μm | 0.75 μm | 0.75 μm | 0.68 μm |
| Pre. Ex. 13 | 0.75 μm | 0.75 μm | 0.75 μm | 0.75 μm | 0.75 μm | 0.74 μm | 0.69 μm |
| Pre. Ex. 14 | 0.75 μm | 0.75 μm | 0.75 μm | 0.75 μm | 0.75 μm | 0.75 μm | 0.75 μm |
| Comp. Ex. 5 | 0.75 μm | 0.75 μm | 0.77 μm | 0.79 μm | 0.83 μm | 0.86 μm | 0.75 μm |

Referring to Table 5 above, in the case of the etchant compositions of the Exemplary Etchants Pre. Ex. 1, 2, 3, 4, 5, 6, 7, 8, 9, 10, 11, 12, 13, and 14 each including 1.0 wt % to 20.0 wt % of the organic acid (acetic acid), the profile of the copper layer may be good.

In contrast, in the case of the etchant composition of Comparative Etchant Comp. Ex. 5 including the organic acid the profile of the copper layer may rapidly become poor with the increase in the number of wiring substrates to be processed.

That is, it can be found that, in the case of the etchant compositions of the Exemplary Etchants Pre. Ex. 1, 2, 3, 4, 5, 6, 7, 8, 9, 10, 11, 12, 13, and 14 each including about 1.0 wt % to 20.0 wt % of the organic, the profile of the copper layer may be improved as compared with the etchant compositions each not including the organic acid.

As described above, according to the etchant composition and the method of manufacturing a wiring substrate according to an exemplary embodiment of the present invention, it is possible to manufacturing a wiring substrate having an excellent profile, for example, an appropriate side inclination angle.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An etchant composition, comprising:
   a peroxosulfate;
   a cyclic amine compound;
   a first compound comprising a carboxyl group and at least one of compounds represented by Formulae Ia, Ib, Ic, Id, and Ie below:

Formula Ia

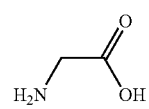

Formula Ib

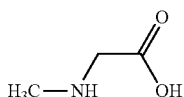

Formula Ic

HO—⟨⟩—C(=O)—OH, with H₂N substituent

Formula Id

H₃C—⟨⟩—C(=O)—OH, with H₂N substituent

Formula Ie (CH₃)₂CH—CH₂—CH(NH₂)—COOH;

and
a second compound comprising a sulfone group,
wherein the second compound is different from the first compound.

2. The etchant composition of claim 1, wherein a weight ratio of the first compound to the second compound is equal to or between 2:1 and 1:5.

3. The etchant composition of claim 2, wherein a weight percentage of the peroxosulfate is greater than a weight percentage of the first compound.

4. The etchant composition of claim 3, wherein the second compound comprises at least one of compounds represented by Formulae IIa, IIb, and IIc below:

Formula IIa

HO—S(=O)(=O)—NH₂

Formula IIb

HO—S(=O)(=O)—O—NH₂

Formula IIc

HO—S(=O)(=O)—CH₂CH₂—NH₂.

5. The etchant composition of claim 1, wherein the weight percentage of the peroxosulfate is equal to or between 1.0 wt % and 20.0 wt %, wherein the weight percentage of the cyclic amine compound is equal to or between 0.1 wt % and 5.0 wt %,
wherein the weight percentage of the first compound is equal to or between 0.01 wt % and 10.0 wt %, and
wherein the weight percentage of the second compound is equal to or between 0.1 wt % and 7.0 wt %.

6. The etchant composition of claim 5, wherein the peroxosulfate comprises potassium peroxodisulfate ($K_2S_2O_8$), sodium peroxodisulfate ($Na_2S_2O_8$), or ammonium peroxodisulfate (($NH_4$)$_2S_2O_8$).

7. The etchant composition of claim 5, wherein the cyclic amine compound comprises at least one of 5-aminotetrazole, 1-methyl-5-aminotetrazole, 5-methyltetrazole, 1-ethyl-5-aminotetrazole, imidazole, indole, purine, pyrazole, pyridine, pyrimidine, pyrrole, pyrrolidine, or pyrroline.

8. The etchant composition of claim 5, further comprising:
equal to or between 0.01 wt % and 2.0 wt % of a fluorine-containing compound;
equal to or between 0.01 wt % and 5.0 wt % of a chlorine-containing compound;
equal to or between 0.5 wt % and 10.0 wt % of an inorganic acid; and
equal to or between 1.0 wt % and 20.0 wt % of an organic acid or an organic acid salt.

9. The etchant composition of claim 8, wherein a weight ratio of the organic acid or the organic acid salt to the first compound is equal to or between 15:1 to 1:2.

10. The etchant composition of claim 9, wherein the fluorine-containing compound comprises at least one of ammonium fluoride, sodium fluoride, potassium fluoride, ammonium bisulfite, sodium bisulfite, and potassium bisulfite.

11. The etchant composition of claim 9, wherein the chlorine-containing compound comprises at least one of hydrochloric acid, sodium chloride, potassium chloride, ammonium chloride, iron chloride (III), sodium perchlorate, potassium perchlorate, ethanesulfonyl chloride, and methanesulfonyl chloride.

12. The etchant composition of claim 9, wherein the inorganic acid comprises at least one of nitric acid ($HNO_3$), sulfuric acid ($H_2SO_4$), phosphoric acid ($H_3PO_3$), and phosphorous acid ($H_2PO_3$).

13. The etchant composition of claim 9, wherein the organic acid comprises at least one of acetic acid, formic acid, propenoic acid, butanoic acid, pentanoic acid, gluconic acid, glycolic acid, malonic acid, oxalic acid, benzoic acid, succinic acid, phthalic acid, salicylic acid, lactic acid, glyceric acid, malic acid, tartaric acid, citric acid, and isocitric acid, and
wherein the organic acid salt comprises a sodium salt, potassium salt or ammonium salt of the organic acid.

14. The etchant composition of claim 8, further comprising:
equal to or between 0.01 wt % and 5.0 wt % of a copper salt, wherein the copper salt comprises copper sulfate, copper chloride, or copper nitrate.

15. A method of manufacturing a wiring substrate, comprising:
forming a first wiring layer on a substrate, comprising:
forming a first metal layer on the substrate;
forming a second metal layer on the first metal layer, the second metal layer being different from the first metal layer; and
patterning the first metal layer and the second metal layer using an etchant composition, comprising:

a peroxosulfate;
a cyclic amine compound;
a first compound comprising a carboxyl group and at least one of compounds represented by Formulae Ia, Ib, Ic, Id, and Ie below:

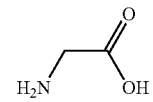

Formula Ia

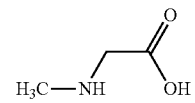

Formula Ib

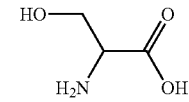

Formula Ic

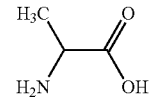

Formula Id

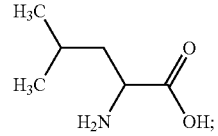

Formula Ie and
a second compound comprising a sulfone group,
wherein the second compound is different from the first compound.

16. The method of claim 15, wherein the first metal layer comprises at least one of a titanium layer and a titanium alloy layer, and
wherein the second metal layer comprises at least one of a copper layer and a copper alloy layer.

17. The method of claim 16, further comprising:
forming a second wiring layer on the substrate before the forming of the first wiring layer,
wherein, in the forming of the first wiring layer, the first wiring layer is formed on the second wiring layer to be insulated from the second wiring layer, and
wherein the second wiring layer comprises at least one of a titanium layer, a titanium alloy layer, a copper layer, and a copper alloy layer, which are mutually laminated.

18. The method of claim 17, wherein a side inclination angle of the second wiring layer is smaller than a side inclination angle of the first wiring layer, and
wherein the side inclination angle of the first wiring layer is equal to or between 55° and 80°.

19. The method of claim 15, wherein the first wiring layer comprises a first region, a second region, and a third region, and
wherein the patterning of the first metal layer and the second metal layer using the etchant composition comprises:
forming a mask pattern on the first region and the second region of the first metal layer and the second metal layer;
primarily etching the third region of the first metal layer and the second metal layer not overlapping the mask pattern, using the etchant composition;

removing the mask pattern on the second region of the first metal layer and the second metal layer; and secondarily etching the second region of the first metal layer and the second metal layer using the etchant composition.

* * * * *